United States Patent
Liao

(10) Patent No.: US 9,293,408 B2
(45) Date of Patent: Mar. 22, 2016

(54) ADDING SYMMETRICAL FILLING MATERIAL IN AN INTEGRATED CIRCUIT LAYOUT

(75) Inventor: Hongmei Liao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 587 days.

(21) Appl. No.: 12/543,677

(22) Filed: Aug. 19, 2009

(65) Prior Publication Data

US 2011/0042818 A1    Feb. 24, 2011

(51) Int. Cl.
*G06F 17/50* (2006.01)
*H01L 23/522* (2006.01)

(52) U.S. Cl.
CPC ....... *H01L 23/522* (2013.01); *H01L 2924/0002* (2013.01)

(58) Field of Classification Search
CPC ... G06F 17/243; G06F 17/2229; G06F 17/24; G06F 17/212; G06F 17/5081; G06F 2217/12; G06F 17/3089
USPC .......................................... 716/55, 118–121
See application file for complete search history.

(56) References Cited

U.S. PATENT DOCUMENTS

| | | | |
|---|---|---|---|
| 7,225,116 B2* | 5/2007 | Harn | 703/14 |
| 7,647,569 B2* | 1/2010 | Chen et al. | 716/104 |
| 7,865,857 B1* | 1/2011 | Chopra et al. | 716/119 |
| 2001/0015773 A1 | 8/2001 | Eldridge et al. | |
| 2004/0040007 A1* | 2/2004 | Harn | 716/11 |
| 2004/0049754 A1* | 3/2004 | Liao et al. | 716/8 |
| 2007/0074142 A1* | 3/2007 | Smayling et al. | 716/21 |
| 2009/0037861 A1* | 2/2009 | Chen et al. | 716/7 |

OTHER PUBLICATIONS

International Search Report and Written Opinion—PCT/US2010/045908, International Search Authority—European Patent Office—Feb. 7, 2011.

* cited by examiner

*Primary Examiner* — Binh Tat
(74) *Attorney, Agent, or Firm* — Michelle S. Gallardo

(57) ABSTRACT

In one embodiment, an integrated circuit has a conductive layer, where the conductive layer has a first set of regions and a second set of fill material regions, and the second set of fill material regions has a line of symmetry. Other embodiments are described and claimed.

26 Claims, 7 Drawing Sheets

ADDING SYMMETRICAL FILLING MATERIAL IN AN INTEGRATED CIRCUIT LAYOUT

FIELD

The present invention relates to electronic integrated circuit design and fabrication, and more particularly to applying filling material regions to a layout.

BACKGROUND

For advanced sub-micron semiconductor integrated circuit fabrication process technology, it is common to add filling material to each critical layer in an integrated circuit. The filling material added to a layer is usually of the same type of material as that used in the layer. For example, if the layer comprises interconnects, then the filling material is the same type of metal as the interconnects.

To planarize the interconnects, CMP (Chemical Mechanical Polishing) is often used during the fabrication process. The CMP process depends on the layout topology, such as for example the metal density and width. The filling material is usually required to achieve the desired density range for each layer in which filling material is added, which helps improve the CMP process window. However, the added filling material, which is usually in the shape of rectangles or polygons, may introduce extra RC (Resistance-Capacitance product) parasitics. Subsequently, this may negatively impact the timing and performance of the resulting integrated circuit.

SUMMARY

In one embodiment, a die has a conductive layer, where the conductive layer has a first set of regions and a second set of regions, with at least one region in the first set of regions is electrically coupled to an active device integrated on the die, where each region in the second set of regions is not electrically coupled to the active device, and the second set of regions has a symmetry axis.

In another embodiment, a method partitions a layout about a line into a first set of regions and a second set of regions; forms a union of the first set of regions and a mirror image of the second set of regions about the line to form a composite layout; and forms a partial fill pattern based upon the composite layout, where the partial fill pattern does not intersect the composite layout.

In another embodiment, an article of manufacture comprises a computer readable medium having instructions to cause the computer to partition a layout about a line into a first set of regions and a second set of regions; form a union of the first set of regions and a mirror image of the second set of regions about the line to form a composite layout; and form a partial fill pattern based upon the composite layout, where the partial fill pattern does not intersect the composite layout.

In another embodiment, a method adds filling material to a layer in an integrated circuit according to a fill pattern, where the layer is represented by a layout. The fill pattern is a union of a partial fill pattern and its mirror image about a line, wherein the partial fill pattern is based upon a composite layout and does not intersect the composite layout. The composite layout is formed from a union of a first set of regions and a mirror image of a second set of regions about the line, where the first and second sets of regions partition the layout about the line.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

For sensitive RF (Radio Frequency) circuits, and many other types of analog circuits, an integrated circuit layer to which filling material is added usually possesses a high degree of symmetry for matching purposes. Some embodiments described herein provide a method to add filling material such that the added filling material is symmetrical. It is expected that this high degree of symmetry should help mitigate the negative impact of the filling material on the RC parasitics and timing performance.

For purposes of describing the embodiments, the term layout will refer to a representation of one or more layers in an integrated circuit. A layout may be described by a set of regions in a plane. For example, a set of regions describing a layout may represent metallic regions in a metal layer of the integrated circuit represented by the layout.

Figure 1:
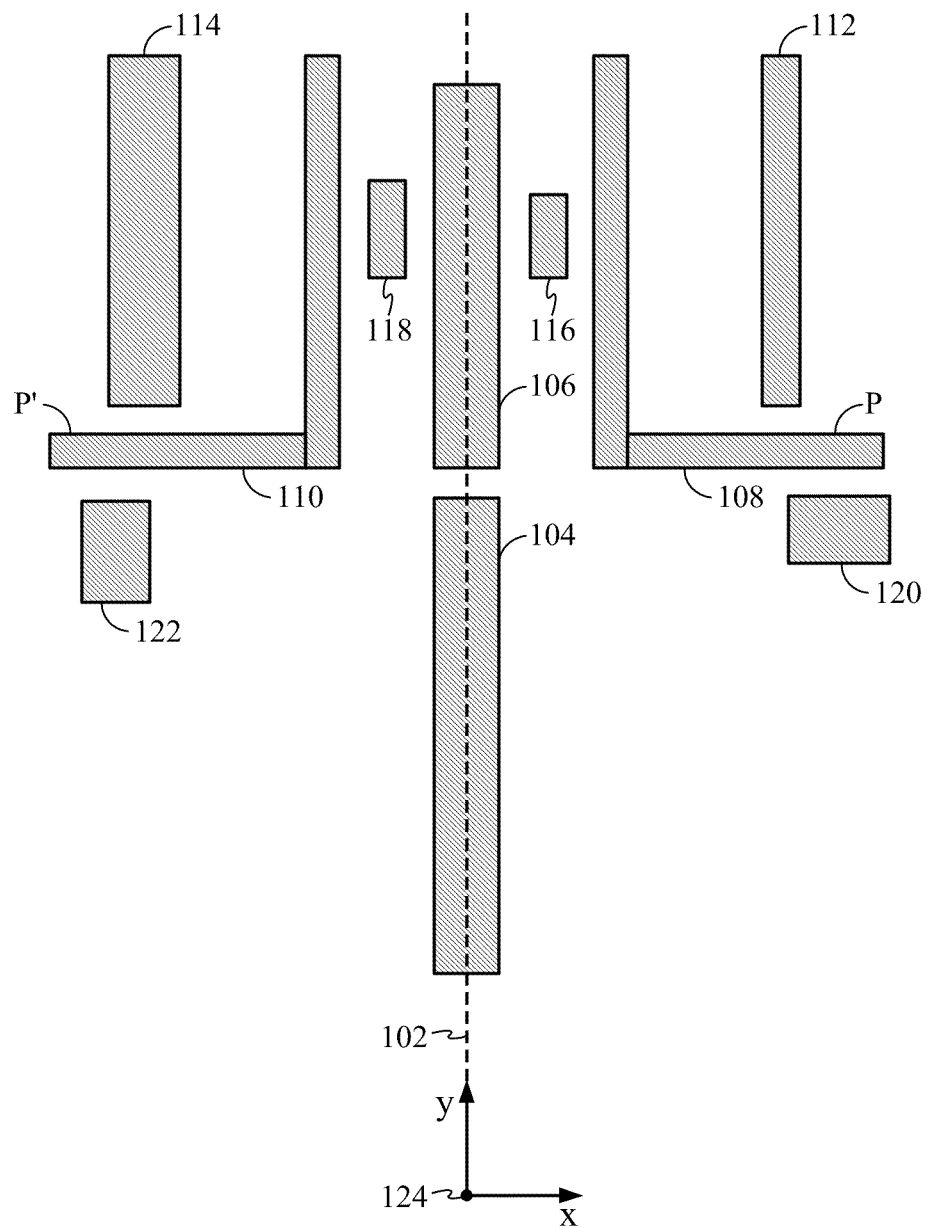
FIG. 1 illustrates the partitioning of a layout.

FIG. 1 illustrates a layout as a set of regions, where each region comprises one or more rectangles, and serves as a starting point for describing the embodiments. The layout illustrated in FIG. 1 is nearly symmetric about the line 102. That is, there is a high degree of symmetry about the line 102. The regions 104 and 106 are symmetric about the line 102, and the regions 108 and 110 are mirror images of each other. However, the regions 112 and 114 are not exactly mirror images of each other; as is also the case for the pair of regions 116 and 118, and the pair of regions 120 and 122.

In practical applications, embodiments make use of a line in a layout for which there is a relatively high degree of symmetry. In describing the embodiments, it is not necessary to define what is meant by a high degree of symmetry. Indeed, embodiments may be practiced in which there is no symmetry about the line that is chosen. However, it is to be expected that an embodiment may be more useful when the layout has a relatively high degree of symmetry about the chosen line than for other cases in which there is less symmetry. Such a line for which there is a high degree of symmetry will be known to a circuit designer during some part of the design phase. Although it is not necessary to precisely define what is meant by a high degree of symmetry when practicing the embodiments, it is nevertheless pedagogically useful to first consider how to give this concept more precision before further describing the embodiments, and such discussion will also serve to introduce notation and define what is meant by a mirror image.

To this end, the statement that the layout in FIG. 1 is nearly symmetric about the line 102 may be discussed in the following way by first discussing mirror images. If the line 102 is considered a y-axis, and if an x-axis is imagined in the plane of the illustration, then for a point having coordinates described by the ordered pair (x, y), its mirror image with respect to the line 102 is the point having coordinates described by the ordered pair (−x, y).

As an example, an x-y coordinate system, with an origin labeled 124, is illustrated in FIG. 1 with its y-axis aligned with the line 102. The x-y coordinate system lies in the plane of the illustration. Each point in this plane has some unique coordinate pair (x', y') relative to this x-y coordinate system. The mirror image of the point (x', y') is the point (−x', y'). For example, the point labeled P in FIG. 1 has as its mirror image the point P'. Clearly, the mirror image of the point P' is the point P. That is, the mirror image of the mirror image of a point is the point itself. One may say that the points P and P' are a mirror image pair, or one may say that they are mirror images of each other.

Whether or not two points are a mirror image pair depends upon the choice of the line through which the mirror image is taken. For example, shifting the line 102 to the right or left, or rotating it by an angle that is not a multiple of π radians, will destroy the mirror image relationship between the points P and P'. However, once a choice is made for the line about which a mirror image is taken, the choice of an x-y coordinate system is arbitrary. The only reason for choosing an x-y coordinate system with a y-axis aligned with the line 102 is that the mathematical transformation for describing the mirror image of a point is very simple: merely take the negative of its x coordinate.

For the case in which a point P lies on the line about which a mirror image is to be taken, it is sufficient for purposes of describing the embodiments to define the mirror image of P to be the same point P.

Although the choice of an x-y coordinate system is arbitrary, the x-y coordinate system shown in FIG. 1 is repeated in FIGS. 2 through 5 to serve as a reference point, so that one may consider the mirror image of the various point sets in the following discussion to be simply those point sets in which the x coordinates have been multiplied by −1.

Continuing with the discussion of what is meant by nearly symmetric, let $\mathcal{R}$ denote the set of points in the layout on one side of the line 102, and let $\mathcal{L}$ denote the set of points in the layout on the other side of the line 102. For example, one may think of $\mathcal{R}$ as the set of points in the layout to the right of the line 102, and $\mathcal{L}$ as the set of points in the layout to the left of the line 102. Let $\mathcal{L}'$ denote the set of all points having a mirror image belonging to $\mathcal{L}$. The set $\mathcal{L}'$ may be termed the mirror image of $\mathcal{L}$. (Note that if the set $\mathcal{L}$ is the set of points in the layout to the left of the line 102, then the set $\mathcal{L}'$ is on the right hand side of the line 102.) The layout is nearly symmetric about the line 102 if the area of the set $\{(\mathcal{R} \cup \mathcal{L}') - (\mathcal{L}' \cap \mathcal{R})\}$ is in some sense small. This set is the symmetric difference of the sets $\mathcal{L}'$ and $\mathcal{R}$, sometimes written as $\mathcal{L}' \Delta \mathcal{R}$, and is the set of points that are in either $\mathcal{L}'$ or $\mathcal{R}$, but not both.

The area of $\mathcal{L}' \Delta \mathcal{R}$ divided by the sum of the areas of $\mathcal{L}'$ and $\mathcal{R}$ is bounded by one. That is, $$0 \leq \frac{\text{Area}\{\mathcal{L}' \Delta \mathcal{R}\}}{\text{Area}\{\mathcal{L}'\} + \text{Area}\{\mathcal{R}\}} \leq 1.$$

This suggests that one possible metric for quantifying the degree of symmetry is to evaluate the above expression. Accordingly, if the expression $$\frac{\text{Area}\{\mathcal{L}' \Delta \mathcal{R}\}}{\text{Area}\{\mathcal{L}'\} + \text{Area}\{\mathcal{R}\}}$$

is a small fraction of one, then one might state that there is a high degree of symmetry.

Figure 2:
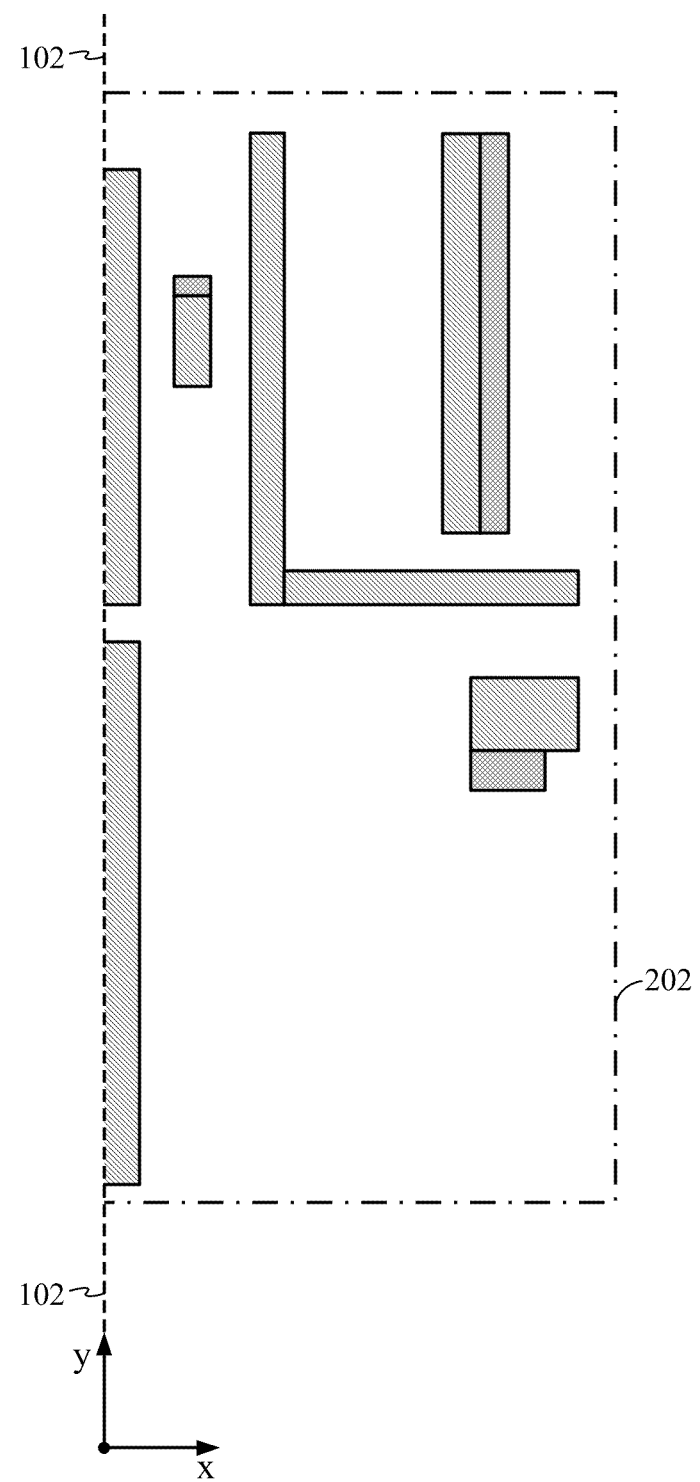
FIG. 2 illustrates a composite layout.

Continuing the description of the embodiments, assume that a line has been chosen so that $\mathcal{L}'$ and $\mathcal{R}$ may be determined as discussed above. The union of these two sets, $\mathcal{L}' \cup \mathcal{R}$, may be termed a composite layout. For the particular layout illustrated in FIG. 1, the resulting composite layout is illustrated in FIG. 2, where the crosshatched areas denote those points in $\mathcal{L}'$ that do not lie in $\mathcal{R}$. In FIG. 2, the dot-dash line 202 indicates the outline of one-half of the die on which the corresponding integrated circuit is fabricated.

Figure 3:
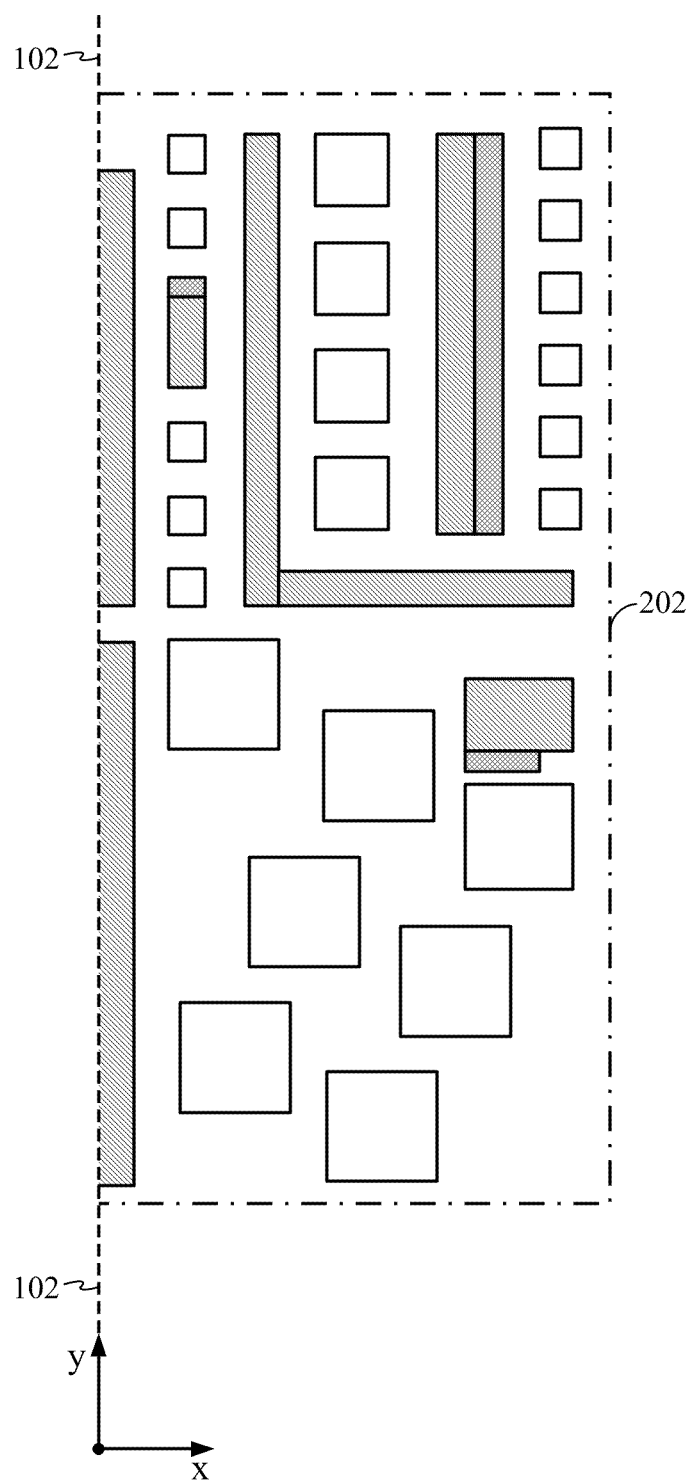
FIG. 3 illustrates filling material regions applied to the composite layout of FIG. 2.

Using the composite layout $\mathcal{L}' \cup \mathcal{R}$, embodiments add filling material regions to $\mathcal{L}' \cup \mathcal{R}$ as if it were a new layout. For example, if $\mathcal{R}$ lies to the right hand side of the chosen line so that $\mathcal{L}' \cup \mathcal{R}$ also lies on the right hand side, then filling material regions are added on the right hand side of the chosen line in accordance with the regions making up the composite layout $\mathcal{L}' \cup \mathcal{R}$. This set of filling material regions may be termed a partial fill pattern. Any filling routine may be implemented to generate the partial fill pattern. The embodiment in FIG. 3 illustrates the composite layout of FIG. 2 in which filling material regions, denoted by empty rectangles, have been added. Filling material regions added to the composite layout are constrained to lie within the outline denoted by the dot-dash line 202.

Figure 4:
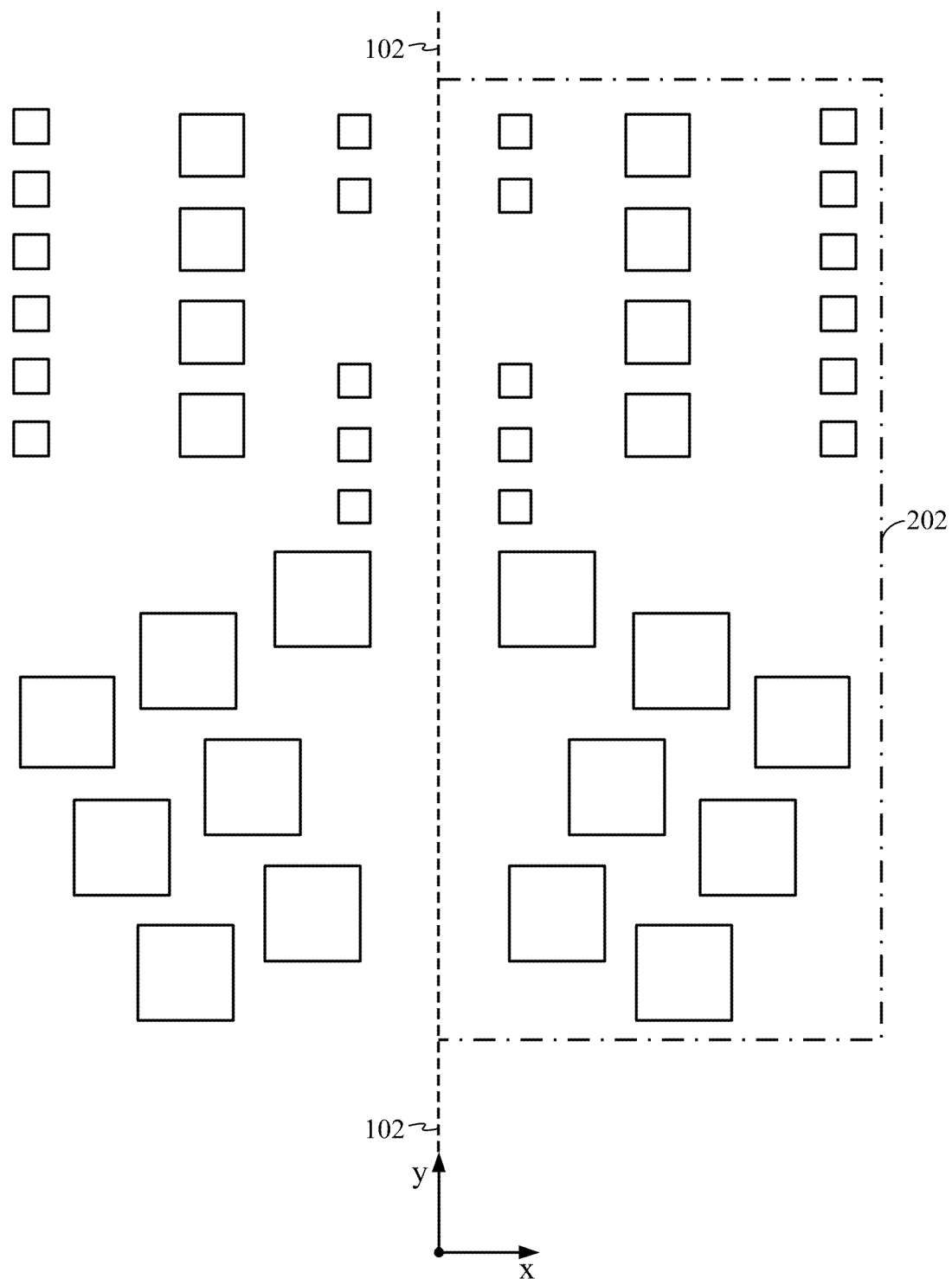
FIG. 4 illustrates a set of filling material regions.

Let $\mathcal{F}$ denote the set of filling material regions added to $\mathcal{L}' \cup \mathcal{R}$, and let $\mathcal{F}'$ denote the mirror image of $\mathcal{F}$ about the chosen line. That is, $\mathcal{F}'$ is the set of all points that have a mirror image in $\mathcal{F}$. Embodiments generate the filling material regions for the entire layout by forming the union of $\mathcal{F}$ with its mirror image. That is, the set of filling material regions is $\mathcal{F} \cup \mathcal{F}'$, the final fill pattern to be applied to the layout. FIG. 4 illustrates the union of the set of filling material regions generated in FIG. 3 with its mirror image.

Figure 5:
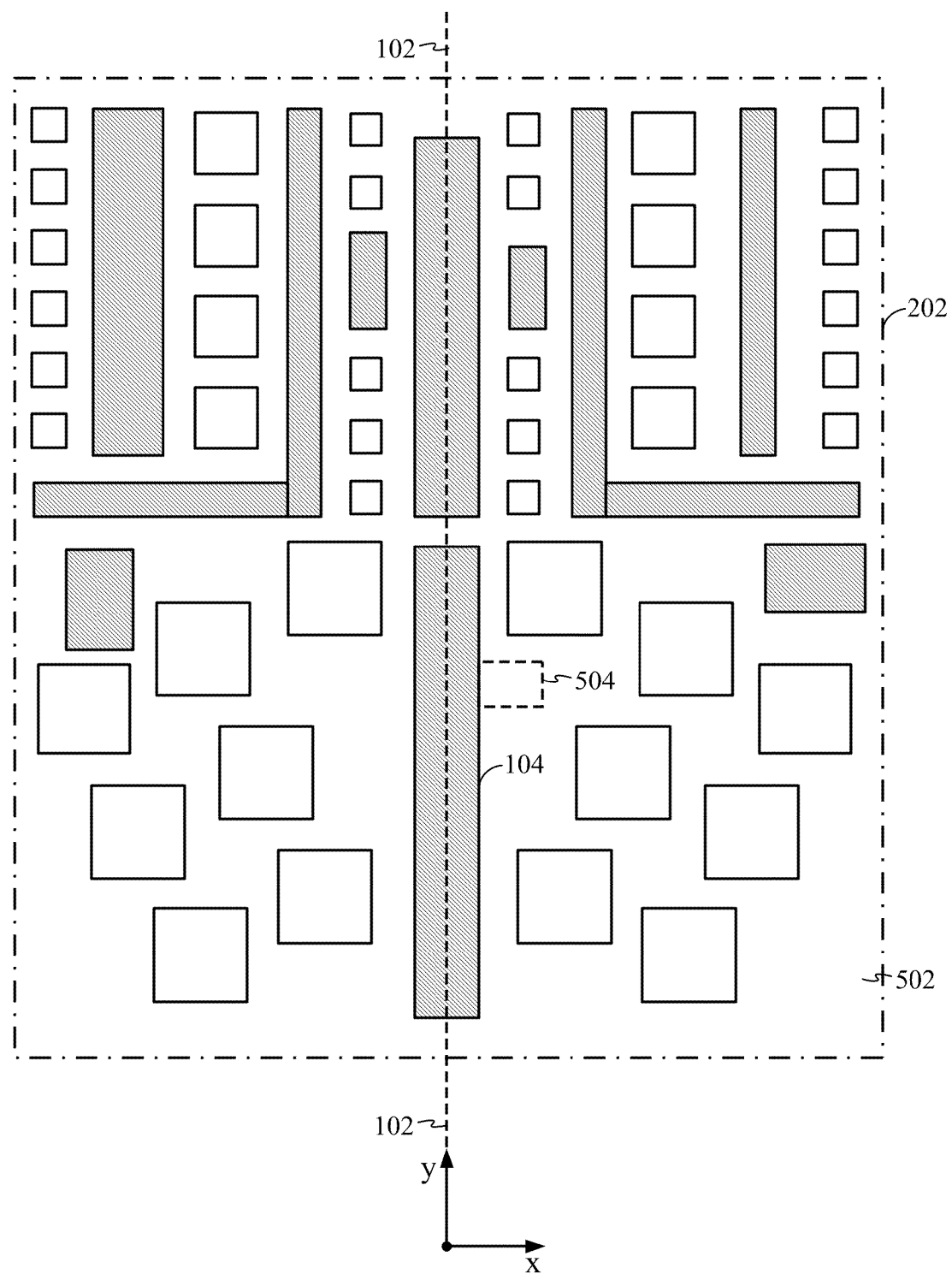
FIG. 5 illustrates the final output layout with filling material regions.

The embodiment of FIG. 5 illustrates the set of filling material regions developed in FIG. 4, together with the original layout of FIG. 1. Up until now, much of the description of the embodiments has focused on generating various sets in which the previous figures may be viewed as a representation of one or more layers of an integrated circuit on a die. The procedure described above may be applied to a number of layouts describing a number of layers in the integrated circuit. With this in mind, the previous figures may be viewed as doing double duty, whereby they not only illustrate the topology of various sets for an example embodiment, but also illustrate an example layer in an integrated circuit formed on a die. Accordingly, another context for FIG. 5 is the illustration of a die 502, where the dot-dash line 202 is an outline of the die 502, and where the hatched rectangles are interconnects that connect to various active devices integrated on the die 502. Because the embodiment of FIG. 5 illustrates interconnects, the filling material is also electrically conductive and is comprised of the same material as the interconnects.

It would obscure the sets of regions in FIG. 5 to illustrate active devices in the integrated circuit, so merely one such active device is represented by the dashed rectangle 504. The active device 504 is in electrical contact with the region (interconnect in this example) 104. For some embodiments, the active device 504 may not be integrated on the same layer as the interconnects and filling material shown in FIG. 5, in which case the active device 504 may be electrically connected to the interconnect 104 by way of a via. For the embodiment illustrated in FIG. 5, each filling material region is not in electrical contact with the active device 504. However, for some embodiments, one or more of the filling material regions may be electrically coupled to other active devices, or a power or ground plane, for example.

Figure 6:
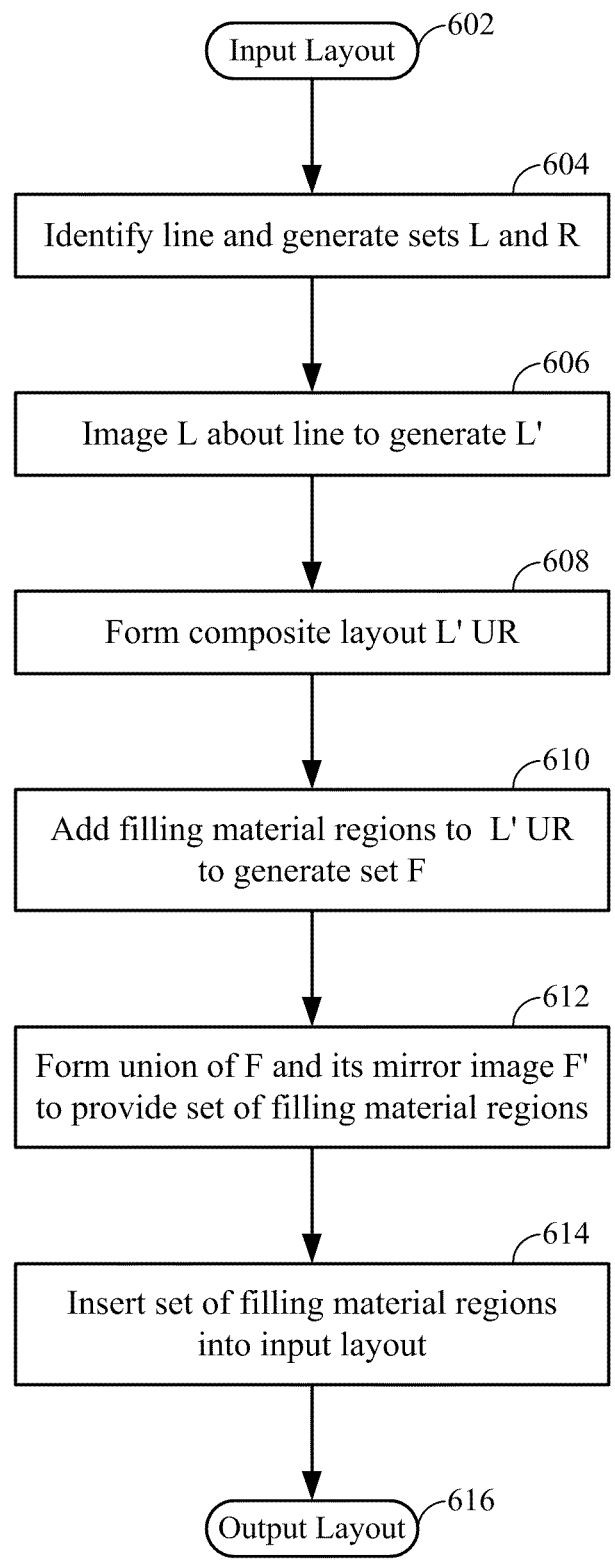
FIG. 6 illustrates a flow diagram for generating a set of filling material regions.

The above description and the embodiments illustrated in FIGS. 1 through 5 illustrate an embodiment method as outlined in the flow diagram of FIG. 6. Starting with an input layout (602), a line is identified that partitions the input layout into two sets (604), denoted in FIG. 6 as the sets "L" and "R". As discussed previously, in practice this line should be chosen such that the input layout has a relatively high degree of symmetry about the line. The mirror image of the set "L" is formed (606), which is denoted in FIG. 6 as "L'". The composite layout is formed from the union of "L'" and "R" (608), and filling material regions are added to the composite layout to form the set "F" (610), which is the partial fill pattern. The union of "F" and its mirror image is formed to provide the set of filling material regions (612), and this set is inserted into the input layout (614) to provide the resulting output layout (616).

Figure 7:
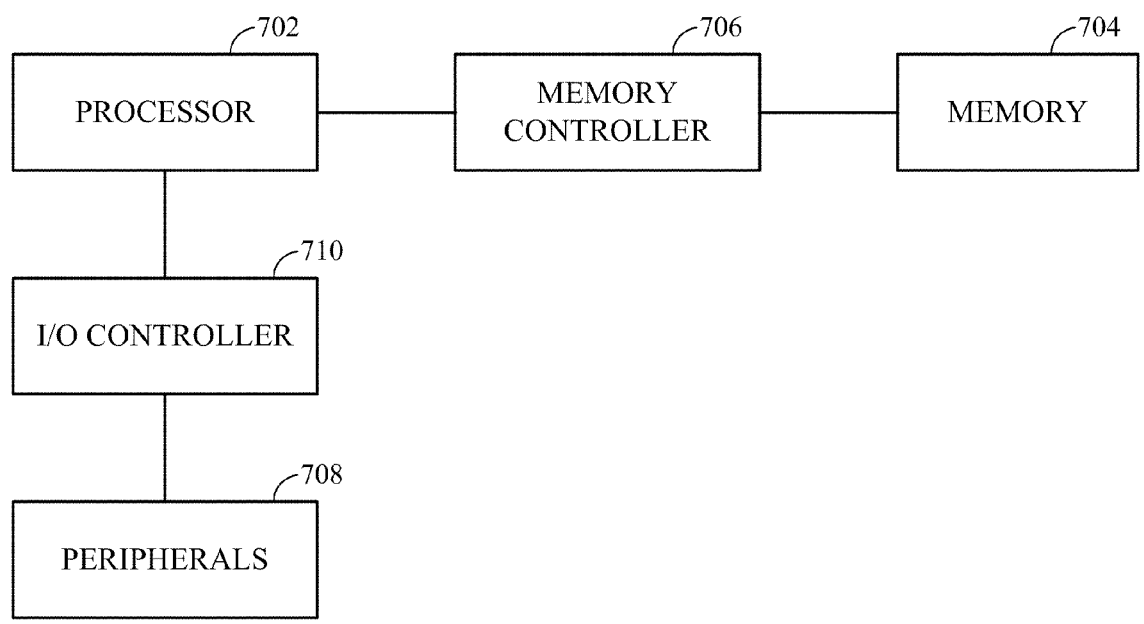
FIG. 7 illustrates a conventional computer system to implement the flow diagram of FIG. 6.

The procedures illustrated in FIG. 6 may be implemented by a computer system, such as that illustrated in FIG. 7, comprising the processor 702 in communication with the computer readable medium (memory) 704 by way of the memory controller 706, and in communication with the peripherals 708 by way of the input and output controller 710. Instructions for carrying out the procedures may be stored in the computer readable medium 704. Some of the computer components illustrated in FIG. 7 may be integrated with the processor 702. The computer readable medium 704 may represent a hierarchy of memory. Embodiments are not limited to running on computer systems such as that illustrated in FIG. 7. For example, special-purpose integrated circuits, or firmware, may be employed.

Various modifications may be made to the described embodiments without departing from the scope of the invention as claimed below.

Throughout the description of the embodiments, various mathematical relationships are used to describe relationships among one or more quantities. For example, a mathematical relationship or mathematical transformation may express a relationship by which a quantity is derived from one or more other quantities by way of various mathematical operations, such as addition, subtraction, multiplication, division, etc. As an example, the mirror image of a point about a line was described. The relationships and transformations described herein are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. A method comprising:
partitioning, by a computer, a layout of regions of a material about a line into a first set of the regions and a second set of the regions, wherein each region of the first set of regions defines a region to be covered by a layer material, and wherein each region of the second set of regions defines a region to be covered by the layer material;
forming a composite layout that comprises a union of the first set and a mirror image of the second set about the line, wherein the composite layout is according to points in a co-ordinate system, wherein the mirror image comprises a set of mirror points on the side of the line having the first set of regions, each mirror point in the set of mirror points having a corresponding point in the second set of regions, wherein the mirror point and the corresponding point have respectively symmetric locations in the co-ordinate system in relation to the line; and
adding a partial fill pattern to the composite layout, wherein the partial fill pattern does not intersect the composite layout.

2. The method as set forth in claim 1, further comprising:
forming a fill pattern of filling material regions, the fill pattern comprising a union of the partial fill pattern and a mirror image of the partial fill pattern about the line.

3. The method as set forth in claim 2, further comprising:
forming a union of the fill pattern and the layout.

4. The method as set forth in claim 3, further comprising:
applying filling material to a layer in a die according to the fill pattern.

5. The method as set forth in claim 1, wherein the layout includes the regions of the first set being symmetrical to the regions of the second set about the line.

6. The method as set forth in claim 1, wherein the partial fill pattern identifies at least one fill region of a layer in a die to be filled with filling material, wherein the at least one fill region is shaped as one or more of a rectangular shape or a polygon shape.

7. The method as set forth in claim 1, wherein the regions of the first set and the regions of the second set identify interconnects of an integrated circuit.

8. The method as set forth in claim 7, wherein the regions of the first set and the regions of the second set further identify active devices of the integrated circuit.

9. The method as set forth in claim 1, further comprising:
determining a symmetric difference between the first set of regions and the second set of regions, the symmetric difference based on mirror points that are not within any region of the first set of regions in combination with points that are, concurrently, within any region of the first set of regions and not within the mirror image.

10. The method as set forth in claim 9, further comprising quantifying a symmetry of the layout, the quantifying based on an area defined by the points in the mirror image, an area defined by the points within the first set of regions, and the symmetric difference.

11. The method as set forth in claim 10, wherein the partitioning includes positioning the line, or rotating the line, or both, to have a line position or a line rotation, or both, at which the quantified symmetry meets a given criterion.

12. The method as set forth in claim 10, wherein the quantified symmetry is based on the symmetric difference divided by a sum of the area of the area defined by the points in the mirror image and the area defined by the points within the first set of regions.

13. The method as set forth in claim 12, wherein the partitioning includes positioning the line, or rotating the line, or both, to have a line position or a line rotation, or both, at which the quantified symmetry is a small fraction of one.

14. The method as set forth in claim 1, wherein the partial fill pattern does not intersect the composite layout such that a set of filling material regions in the partial fill pattern do not intersect any of the regions in the first set and a mirror image of the set of filling material regions about the line do not intersect any of the regions in the second set.

15. An article of manufacture comprising a non-transitory computer readable medium with instructions thereon to cause a computer to:
    partition a layout of regions of a material about a line into a first set of the regions and a second set of the regions, wherein each region of the first set of regions defines a region to be covered by a layer material, and wherein each region of the second set of regions defines a region to be covered by the layer material;
    form a composite layout that comprises a union of the first set and a mirror image of the second set about the line, wherein the composite layout is according to points in a co-ordinate system, wherein the mirror image comprises a set of mirror points on the side of the line having the first set of regions, each mirror point in the set of mirror points having a corresponding point in the second set of regions, wherein the mirror point and the corresponding point have respectively symmetric locations in the co-ordinate system in relation to the line; and
    add a partial fill pattern to the composite layout, wherein the partial fill pattern does not intersect the composite layout.

16. The article of manufacture as set forth in claim 15, the instructions further causing the computer to:
    form a fill pattern of filling material regions, the fill pattern comprising a union of the partial fill pattern and a mirror image of the partial fill pattern about the line.

17. The article of manufacture as set forth in claim 16, the instructions further causing the computer to:
    form a union of the fill pattern and the layout.

18. The article of manufacture as set forth in claim 15, wherein the layout includes the regions of the first set being symmetrical to the regions of the second set about the line.

19. The article of manufacture as set forth in claim 18, wherein the regions of the first set being symmetrical to the regions of the second set about the line comprises a degree of symmetry being a small fraction of one, wherein the degree of symmetry comprises a symmetric difference between the first set of regions and the second set of regions divided by a sum of the area of the area defined by the points in the mirror image and the area defined by the points in the first set of regions, wherein the symmetric difference is based on mirror points that are not within any region of the first set of regions in combination with points that are, concurrently, within any region of the first set of regions and not within the mirror image.

20. A method comprising:
    adding filling material to a layer in an integrated circuit according to a fill pattern, the layer represented by a layout of regions of a layer material, wherein each region of a first set of regions defines a region to be covered by the layer material, and wherein each region of a second set of regions defines a region to be covered by the layer material, wherein the fill pattern is a union of a partial fill pattern and a mirror image of the partial fill pattern about a line, wherein the partial fill pattern is added to a composite layout and does not intersect the composite layout; wherein the composite layout comprises a union of the first set of the regions and a mirror image of the second set of the regions about the line; wherein the first and second sets of the regions form a partition of the layout about the line; and wherein the composite layout is according to points in a co-ordinate system, wherein the mirror image comprises a set of mirror points on the side of the line having the first set of regions, each mirror point in the set of mirror points having a corresponding point in the second set of regions, wherein the mirror point and the corresponding point have respectively symmetric locations in the co-ordinate system in relation to the line.

21. The method as set forth in claim 20, wherein the layout includes the regions of the first set being symmetrical to the regions of the second set about the line.

22. The method as set forth in claim 20, wherein the integrated circuit includes a radio frequency circuit.

23. The method as set forth in claim 20, wherein the filling material is a metal.

24. The method as set forth in claim 23, wherein the metal is a same metal as used in at least one interconnect included in the layer.

25. An apparatus, comprising:
    means for partitioning a layout of regions of a material about a line into a first set of the regions and a second set of the regions, wherein each region of the first set of regions defines a region to be covered by a layer material, and wherein each region of the second set of regions defines a region to be covered by the layer material;
    means for forming a composite layout that comprises a union of the first set and a mirror image of the second set about the line, wherein the composite layout is according to points in a co-ordinate system, wherein the mirror image comprises a set of mirror points on the side of the line having the first set of regions, each mirror point in the set of mirror points having a corresponding point in the second set of regions, wherein the mirror point and the corresponding point have respectively symmetric locations in the co-ordinate system in relation to the line; and
    means for adding a partial fill pattern to the composite layout, wherein the partial fill pattern does not intersect the composite layout.

26. An apparatus, comprising:
    at least one processor configured to
        partition a layout of regions of a material about a line into a first set of the regions and a second set of the regions, wherein each region of the first set of regions defines a region to be covered by a layer material, and wherein each region of the second set of regions defines a region to be covered by the layer material;
        form a composite layout that comprises a union of the first set and a mirror image of the second set about the line wherein the composite layout is according to points in a co-ordinate system, wherein the mirror image comprises a set of mirror points on the side of the line having the first set of regions, each mirror point in the set of mirror points having a corresponding point in the second set of regions, wherein the mirror point and the corresponding point have respectively symmetric locations in the co-ordinate system in relation to the line, and
        add a partial fill pattern that does not intersect the composite layout to the composite layout; and
    a memory coupled to the at least one processor.

* * * * *